US009472526B2

(12) United States Patent
Suzuki et al.

(10) Patent No.: US 9,472,526 B2
(45) Date of Patent: Oct. 18, 2016

(54) SEMICONDUCTOR DEVICE WITH EXTERNAL CONNECTION BUMPS

(71) Applicant: Synaptics Japan GK, Tokyo (JP)

(72) Inventors: Shinya Suzuki, Tokyo (JP); Kiichi Makuta, Tokyo (JP)

(73) Assignee: Synaptics Japan GK, Tokyo (JP)

( * ) Notice: Subject to any disclaimer, the term of this patent is extended or adjusted under 35 U.S.C. 154(b) by 0 days.

(21) Appl. No.: 14/672,713

(22) Filed: Mar. 30, 2015

(65) Prior Publication Data
US 2015/0279800 A1 Oct. 1, 2015

(30) Foreign Application Priority Data

Mar. 31, 2014 (JP) ................. 2014-074075

(51) Int. Cl.
| H01L 23/48 | (2006.01) |
| H01L 23/52 | (2006.01) |
| H01L 29/40 | (2006.01) |

(Continued)

(52) U.S. Cl.
CPC .............. *H01L 24/14* (2013.01); *H01L 23/50* (2013.01); *H01L 23/585* (2013.01); *H01L 24/17* (2013.01); *H01L 27/3223* (2013.01); *H01L 21/4825* (2013.01); *H01L 2224/13013* (2013.01); *H01L 2224/1403* (2013.01); *H01L 2224/14051* (2013.01); *H01L 2224/14133* (2013.01); *H01L 2224/14134* (2013.01); *H01L 2224/14517* (2013.01); *H01L 2224/17517* (2013.01); *H01L 2225/06517* (2013.01); *H01L 2924/30205* (2013.01)

(58) Field of Classification Search
CPC .......... H01L 2224/02333; H01L 2224/10125; H01L 2224/1411; H01L 2224/17106; H01L 2224/17517; H01L 2224/81951; H01L 2224/14133; H01L 2224/14517; H01L 24/14; H01L 2924/30205; H01L 2224/1403; H01L 2224/14515; H01L 2224/161; H01L 2224/17; H01L 2224/1703; H01L 2224/171; H01L 2224/17515; H01L 2224/8111; H01L 2224/10155; H01L 24/10; H01L 21/4825; H01L 23/3128; H01L 23/488; H01L 23/60; H01L 2225/06517; H01L 27/0248
USPC .................. 257/737, 780, E23.021, E23.033
See application file for complete search history.

(56) References Cited

U.S. PATENT DOCUMENTS

| 2006/0033852 A1* | 2/2006 | Kim ..................... G09G 3/3648 349/38 |
| 2007/0096344 A1* | 5/2007 | Matsuura .......... H01L 23/49838 257/786 |

(Continued)

FOREIGN PATENT DOCUMENTS

JP 2007103848 A * 4/2007

*Primary Examiner* — Teresa M Arroyo
(74) *Attorney, Agent, or Firm* — Patterson + Sheridan, LLP

(57) ABSTRACT

A semiconductor device includes a main structure, active bumps and dummy bumps which are provided over a surface of the main structure. The active bumps are arranged in first to n-th rows. The active bumps positioned in each row are arrayed in a first direction with a predetermined first pitch. The first to n-th rows of the active bumps are arrayed in a second direction perpendicular to the first direction. For j being any integer from one to n−1, a (j+1)-th row are shifted in the second direction from a j-th row of the active bumps by a second pitch and shifted in the first direction from the j-th row of the active bumps by a predetermined sub-pitch. The dummy bumps are arrayed in the first direction with the first pitch, and the length of each of the dummy bumps in the second direction is longer than the second pitch.

18 Claims, 19 Drawing Sheets

(51) Int. Cl.
  *H01L 23/00* (2006.01)
  *H01L 23/50* (2006.01)
  *H01L 23/58* (2006.01)
  *H01L 27/32* (2006.01)
  *H01L 21/48* (2006.01)

(56) References Cited

U.S. PATENT DOCUMENTS

2009/0212426 A1* 8/2009 Ishizeki ............ H01L 21/76816
                                                        257/737
2009/0302464 A1* 12/2009 Nakagawa ........ H01L 23/49833
                                                        257/737
2011/0018129 A1* 1/2011 Suzuki .................... H01L 24/10
                                                        257/737
2011/0095418 A1* 4/2011 Lim .................... H01L 23/3128
                                                        257/737
2012/0080789 A1* 4/2012 Shiota ..................... H01L 24/14
                                                        257/737
2014/0054765 A1* 2/2014 Yang ................. H01L 23/49811
                                                        257/737
2014/0061897 A1* 3/2014 Lin ........................ H01L 24/06
                                                        257/737

* cited by examiner

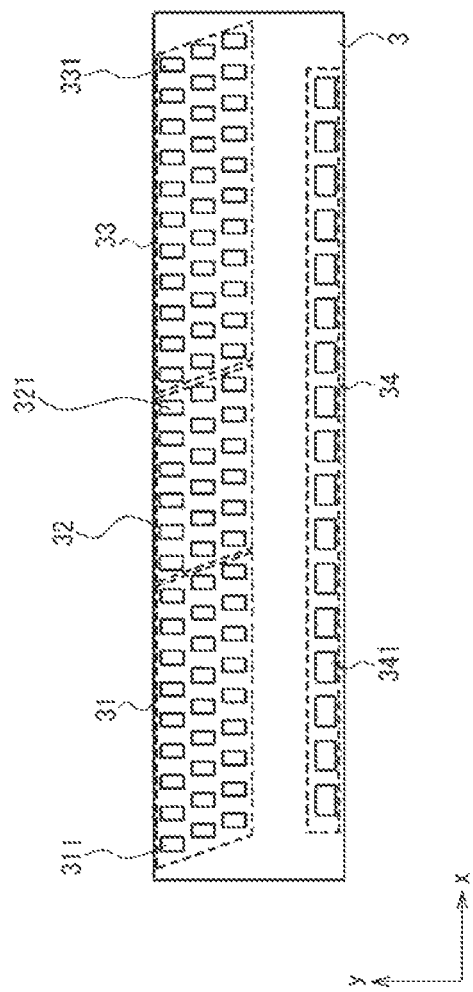

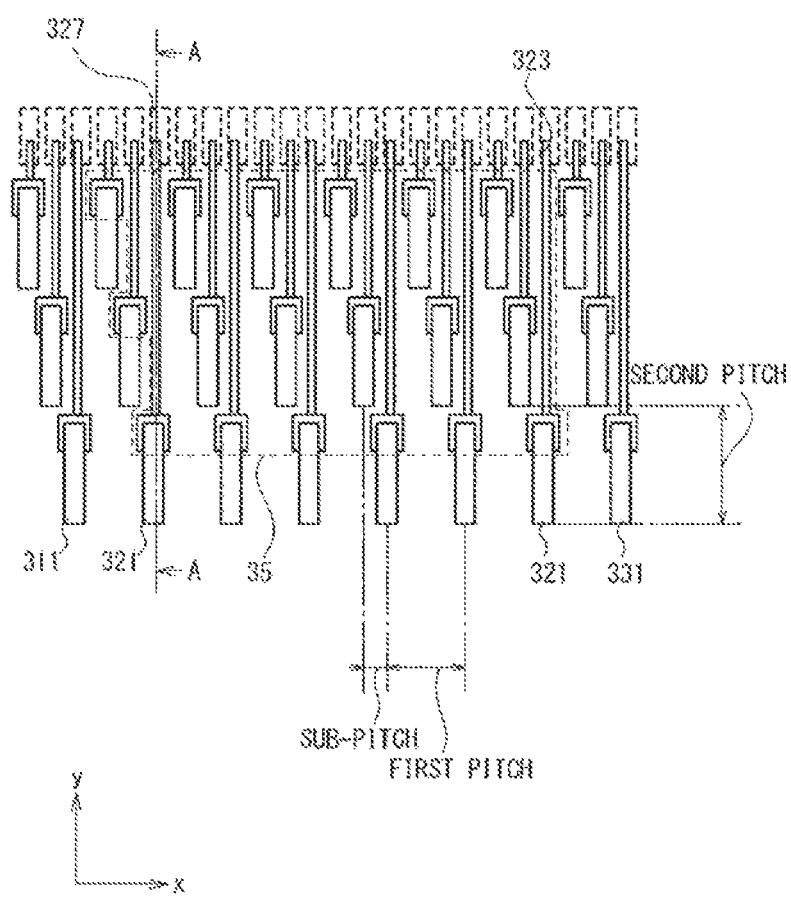

Fig. 5
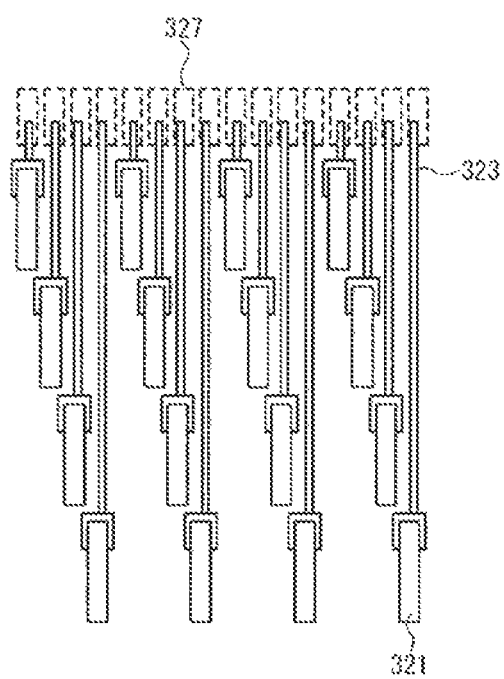
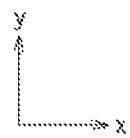

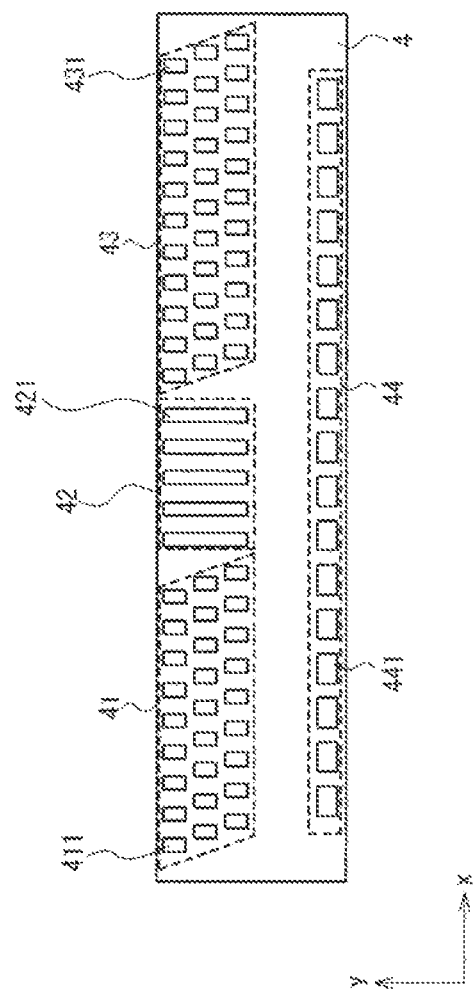

Fig. 10A
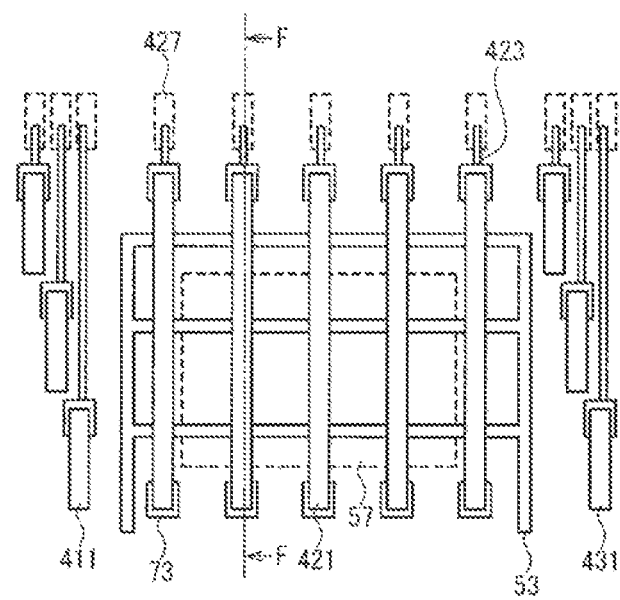
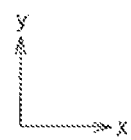

SEMICONDUCTOR DEVICE WITH EXTERNAL CONNECTION BUMPS

CROSS REFERENCES

This application claims priority of Japanese Patent Application No. 2014-074075, filed on Mar. 31, 2014, the disclosure which is incorporated herein by reference.

TECHNICAL FIELD

The present invention relates to a semiconductor device, more particularly to a semiconductor device including dummy bumps in addition to active bumps.

BACKGROUND ART

A semiconductor device may include dummy bumps that are originally unnecessary for circuit operations, in addition to active bumps that achieve electrical connections with external devices for receiving and transmitting power supply voltages and signals.

In the following, a liquid crystal driver including dummy bumps is discussed as one example of such a semiconductor device.

A liquid crystal driver is often mounted on a glass substrate of a display panel. In one known structure for mounting a liquid crystal driver on a display panel, active bumps disposed on the liquid crystal driver are pressed against electrode pads disposed on a glass substrate across an ACF (anisotropic conductive film) to provide electrical connections between the active bumps and the electrode pads.

In a mounting technique using an ACF, it is desirable that bumps are substantially evenly arranged over the surface of the semiconductor device. Accordingly, dummy bumps that have a similar shape to the active bumps may be arranged in a region of the surface of the semiconductor device where the active bumps are not arranged.

Although such dummy bumps are unnecessary for circuit operations of the semiconductor device, protection elements are connected with the dummy bumps as is the case with the active bumps, due to the necessity of electrostatic discharge protection. Interconnections that provide electrical connections between the dummy bumps and the protection elements are further disposed as top metal layers which are closest to the surface of the semiconductor device.

Undesirably, significant portion of the surface of the semiconductor device is occupied by top metal interconnections that connect the dummy bumps with the protection elements. The top metal interconnections which are closest to the surface of the semiconductor device can have a reduced impedance, since the top metal interconnections are allowed to have an increased thickness and width, compared with those disposed inside of the semiconductor device. Accordingly, the top metal interconnections are suitable for use as interconnections of a power supply system.

Especially, an interconnection which supplies a power supply voltage to a module integrated in an internal region of the semiconductor device just below a dummy bump is desirably formed as a top metal interconnection.

Japanese Patent Application Publication No. 2007-103848 A discloses a semiconductor device related to the above-described background. The semiconductor device disclosed in this patent document includes a semiconductor chip. The semiconductor chip includes a pad, a dielectric film and a bump electrode. The pad is formed on a semiconductor substrate. The dielectric film has an opening which exposes the top face of the pad. The bump electrode is formed to cover the dielectric film, including the opening. The size of the pad is smaller than the bump electrode. An interconnection other than the pad is formed below the bump electrode across the dielectric film.

SUMMARY OF INVENTION

One embodiment described herein is a semiconductor device that includes a main structure including a semiconductor substrate, a plurality of active bumps provided over a surface of the main structure, and a plurality of dummy bumps provided over the surface of the main structure. Moreover, the active bumps are arranged in first to n-th rows, where n is an integer equal to two or more and the active bumps are arrayed with a first pitch in a first direction that is parallel to the surface of the main structure. Further, the first to n-th rows of the active bumps are arrayed in an ascending order in a second direction parallel to the surface of the main structure and perpendicular to the first direction and, for j being any integer from one to n−1, a (j+1)-th row of the active bumps are shifted in the second direction from a j-th row of the active bumps by a second pitch and shifted in the first direction from the j-th row of the active bumps by a predetermined sub-pitch. Moreover, the dummy bumps are arrayed in the first direction with the first pitch where the length of each of the dummy bumps in the second direction is longer than the second pitch.

Another embodiment described herein is an apparatus that includes a main structure including a semiconductor substrate, a plurality of active bumps provided over a surface of the main structure, and a plurality of dummy bumps provided over the surface of the main structure. Further, the active bumps are arranged in at least two rows with a first pitch in a first direction that extends along the rows. Moreover, the rows are arranged in a staggered arrangement such that active bumps in two adjacent rows are misaligned in a second direction perpendicular to the first direction. The dummy bumps are arrayed in the first direction where the length of each of the dummy bumps in the second direction is longer than a length of each of the active bumps in the second direction.

Another embodiment described herein is a system that includes a display panel, a main structure including a semiconductor substrate, first and second pluralities of active bumps provided over a surface of the main structure, and a plurality of dummy bumps provided over the surface of the main structure and disposed between the first and second plurality of active bumps. Further, both the first and second pluralities of active bumps are arranged in at least two rows with a first pitch in a first direction that extends along the rows. The rows are arranged in a staggered arrangement such that active bumps in two adjacent rows are misaligned in a second direction perpendicular to the first direction. Moreover, the dummy bumps are arrayed in the first direction where the length of each of the dummy bumps in the second direction is longer than a length of each of the active bumps in the second direction.

BRIEF DESCRIPTION OF THE DRAWINGS

FIG. 2 illustrates an exemplary arrangement of bumps on a semiconductor device;

FIG. 3A is a plan view illustrating a detailed example of the arrangement of active bump groups and a dummy bump group illustrated in FIG. 2;

FIG. 5 illustrates an exemplary arrangement of dummy bumps that are arranged in a four-row staggered arrangement;

FIG. 6A illustrates the arrangement of bumps in one configuration example of a semiconductor device in a one embodiment of the present invention;

FIG. 10A illustrates illustrating one example the arrangement of dummy bumps, active bumps and a power supply top metal interconnection in a semiconductor device according to a fourth embodiment.

DESCRIPTION OF PREFERRED EMBODIMENTS

The invention will be now described herein with reference to illustrative embodiments. Those skilled in the art would recognize that many alternative embodiments can be accomplished using the teachings of the present invention and that the invention is not limited to the embodiments illustrated for explanatory purposed.

Accordingly, one objective of the present invention is to secure a region in which a top metal interconnection is allowed to be flexibly placed just under a group of dummy bumps. Other objectives and new features will be understood from the disclosure of the Specification and attached drawings.

In one embodiment, active bumps are arranged in a staggered arrangement and dummy bumps having a longer length than the active bumps are arrayed in a certain direction near the active bumps. The dummy bump contacts that provide electrical connections for the dummy bumps are also arrayed in the certain direction.

The present invention allows securing a region in which a top metal interconnection is allowed to be flexibly placed just under a group of dummy bumps.

In the following embodiments, liquid crystal drivers are described as examples of semiconductor devices including dummy bumps. For easy understanding of embodiments of the present embodiment, a description is first given of one example of a liquid crystal driver.

Figure 1:
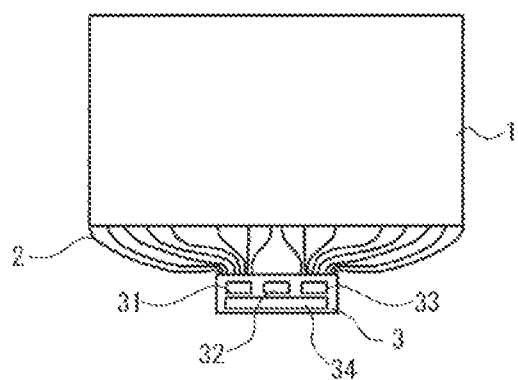
FIG. 1 is a block diagram schematically illustrating one example of a connection between a liquid crystal display panel and a liquid crystal driver.

FIG. 1 is a block diagram schematically illustrating one example of a connection between a liquid crystal display panel 1 and a semiconductor device 3 that is configured as a liquid crystal driver. In FIG. 1, the numeral "2" denotes a group of interconnections.

The semiconductor device 3 includes a first active bump group 31, a dummy bump group 32, a second active bump group 33 and a power supply bump group 34.

Although the interconnections 2 are separately illustrated from the display panel 1 in FIG. 1, the interconnections 2 may be integrated on the display panel 1 in one embodiment.

The display panel 1 includes a plurality of electrode pads disposed on a glass substrate. The interconnections 2 provide connections between the electrode pads of the display panel 1 and the active bumps of the semiconductor device 3.

In one embodiment, the width of the display panel 1 is wider than the width of the semiconductor device 3, and the allowed minimum spacing of interconnections formed on a glass substrate is wider than the allowed minimum spacing of interconnections integrated in a semiconductor device. On the other hand, it may be desirable that the lengths of interconnections formed on a glass substrate are reduced as short as possible.

Accordingly, in one embodiment, active bumps may be grouped into two groups which are arranged at respective ends of the semiconductor device in the width direction.

In such an arrangement, the dummy bump group 32 may be disposed between the two active bump groups 31 and 33 to improve the precision of the device mounting with an ACF by enhancing the evenness of the bump arrangement.

FIG. 2 illustrates an exemplary arrangement of the bump groups 31 to 34 on the semiconductor device 3. As described above, the semiconductor device 3 includes the first active bump group 31, the dummy bump group 32, the second active bump group 33 and the power supply bump group 34.

The first active bump group 31 includes a plurality of active bumps 311, and the second active bump group 33 includes a plurality of active bumps 331. The dummy bump group 32 includes a plurality of dummy bumps 321. The power supply bump group 34 includes a plurality of power supply bumps 341.

In the example illustrated in FIG. 2, the first active bump group 31, the dummy bump group 32 and the second active bump group 33 are arranged along the edge facing the +y direction (which is illustrated as the upper edge in FIG. 2) of the semiconductor device 3. The power supply bump group 34 is, on the other hand, arranged a long an edge facing the −y direction (which is illustrated as the lower edge in FIG. 2) of the semiconductor device 3.

The first active bump group 31 is arranged near the left edge (the edge facing the −x direction) of the semiconductor device 3 and the second active bump group 33 is arranged near the right edge (the edge facing the +x direction) of the semiconductor device 3. The dummy bump group 32 is arranged between the first active bump group 31 and the second active bump group 33.

In the example illustrated in FIG. 2, the active bumps of the first and second active bump groups 31 and 33 and the dummy bumps of the dummy bump group 32 are arranged on the surface of the semiconductor device 3 to form a "three-row staggered arrangement" in total.

The "staggered arrangement" is an arrangement in which, for example, a plurality of elements are arrayed in rows and columns with a first pitch in the horizontal direction and a second pitch in the vertical direction, wherein elements in adjacent rows are shifted from each other in the horizontal direction by a half of the first pitch. If a staggered arrangement includes two rows arrayed in the vertical direction, the staggered arrangement is also referred as two-row staggered arrangement. The same goes for the case when three or more rows are arrayed in the vertical direction.

In a three-row staggered arrangement illustrated in FIG. 2, the second row from the top (that is, the middle row), is shifted rightward by one third of the pitch with respect to the top row and the third row from the top (that is, the bottom row) is shifted rightward by two third of the pitch.

Figure 3B:
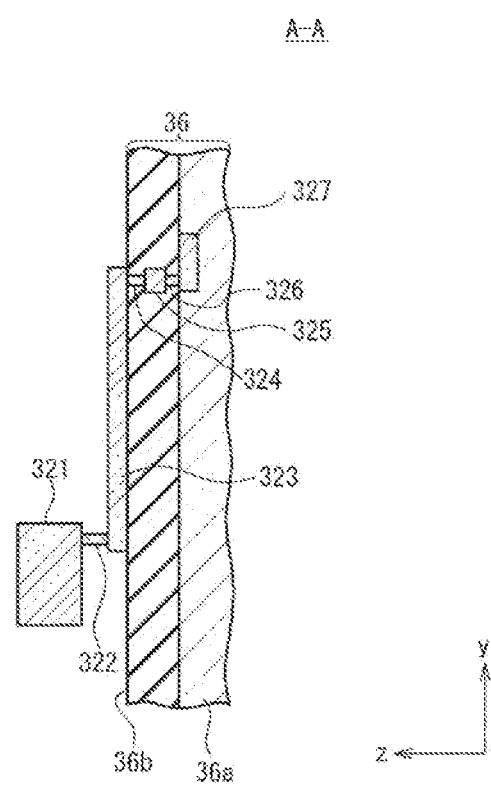
FIG. 3B is a sectional view illustrating the cross-section structure of the semiconductor device on the section A-A indicated in FIG. 3A.

FIG. 3A is a plan view illustrating a detailed example of the arrangement of the active bump groups 31, 33 and the dummy bump group 32 and FIG. 3B is a sectional view illustrating the cross-section structure of the semiconductor device 3 on the section A-A indicated in FIG. 3A.

The structure illustrated in FIG. 3A includes a plurality of first active bumps 311, a plurality of dummy blimps 321, a plurality of second active bumps 331, a plurality of protection elements 327, and a plurality of top metal interconnections 323, which are used for providing electrical connections with the protection elements 327. Illustrated in the sectional view of in FIG. 3B are a dummy bump 321, a contact 322, a top metal interconnection 323, a first through-hole contact 324, an internal interconnection 325, a second through-hole contact 326 and a protection element 327.

In FIG. 3A, the protection elements 327 are indicated by broken lines since the protection elements 327 are integrated with in a main structure 36 of the semiconductor device 3 illustrated in FIG. 2, wherein the main structure 36 includes a semiconductor substrate 36a incorporating various elements (including the protection elements 327) and internal interconnections (one shown) that provide connections among the elements. Other elements illustrated in FIG. 3A are provided on or over the main structure 36 of the semiconductor device 3.

The connections among the elements illustrated in FIGS. 3A and 3B are as follows: Each dummy bump 321 is electrically connected with a protection element 327 via a contact 322, a top metal interconnection 323, a first through-hole contact 324, an internal interconnection 325 and a second through-hole contact 326, which are serially connected in this order. The connection between a dummy bump 321 and a protection element 327 may be variously modified, depending on the arrangement of the protection element 327. For example, a dummy bump 321 and a protection element 327 may be connected via a single through-hole contact in place of the combination of the first through-hole contact 324, the internal interconnection 325 and the second through-hole contact 326. Alternatively, additional internal interconnections and/or through-hole contacts may be used.

Referring back to FIG. 3B, the dummy bump 321 is connected with the top surface 36b of the main structure 36 via the contact 322 and the top metal interconnection 323. Each dummy bump 321 is spaced from the top surface 36b of the main structure 36 of the semiconductor device 3 by a predetermined spacing. The spacing between the dummy bumps 321 and the top surface 36b of the main structure 36, which mainly depends on the structure of the contacts 322, is preferably equal for all the dummy bumps 321. All the dummy bumps 321 are arranged along the top surface 36b of the main structure 36 of the semiconductor device 3.

Although not illustrated, the first and second active bumps 311 and 331 are structured similarly to the dummy bumps 321. All the active bumps 311 and 331 of the first and second active bump groups 31 and 33 are also arranged along the top surface 36b of the main structure 36 of the semiconductor device 3. It is preferable that the spacing from the top surface 36b of the main structure 36 of the semiconductor device 3 is equal for all of the active bumps 311, 331 and the dummy bumps 321. Each of the active bumps 311 and 331 is also electrically connected with a protection element 327 via a contact 322, a top metal interconnection 323, a first through-hole contact 324, an internal interconnection 325 and a second through-hole contact 326, which are serially connected in this order. It should be noted however that the active bumps 311 and 331 are further connected with a circuit related to signaling to the display panel 1, as opposed to the dummy bumps 321.

In the example illustrated in FIG. 3A, the active bumps 311, 331 and the dummy bumps 321 are arranged in a "three-row staggered arrangement". In the following, the pitch with which the active bumps 311 and 331 and the dummy bumps 321 are arrayed in the horizontal direction (the x-axis direction) is referred to as the first pitch, and the pitch with which the active bumps 311 and 331 and the dummy bumps 321 are arrayed in the vertical direction (the y-axis direction) is referred to as the second pitch. Furthermore, the amount of the shift between adjacent rows of bumps is referred to as the sub-pitch.

In the structure illustrated in FIGS. 3A and 3B, the same number of top metal interconnections 323, which provide electrical connections between the dummy bumps 321 and the protection elements 327, as the dummy bumps 321 are arranged just below the dummy bumps 321 (located in the −z direction with respect the dummy bumps 321). Furthermore, the lengths of the top metal interconnections 323 vary depending on the rows of the dummy bumps 321 to which the respective top metal interconnections 323 are connected. This results in that a top metal interconnection placement impossible region 35, in which other top metal interconnections cannot be placed, occupies a significant area of the top surface 36b of the main structure 36.

It should be noted that there inevitably exist the top metal interconnection placement impossible region 35 as long as the active bumps 311, 331 and the dummy bumps 321 are arranged in a staggered arrangement regardless of the number of rows of the bumps.

In the following, an n-row staggered arrangement is defined as follows: The integer "n" indicates the number of rows in the staggered arrangement. For a specific face on which elements (the bumps, in the present embodiment) are arranged, the pitch of the elements in a first direction included in the specific face is referred to as the first pitch, whereas the pitch of the elements in a second direction that is perpendicular to the first direction and included in the specific face is referred to as the second pitch. One n-th of the first pitch is referred to as the sub-pitch.

The active bumps 311, 331 and dummy bumps 321 are arrayed in n rows and the contacts 322 are also arrayed in n rows. The active bumps 311, 331 and dummy bumps 321 are grouped into first to n-th bump groups depending on the rows. The bumps (including the active bumps 311, 331 and dummy bumps 321) arrayed in the i-th row are collectively referred to as the i-th bump group, where i is an integer from one to n. The first to n-th rows of the active bumps 311, 331 and dummy bumps 321 are arrayed in the second direction in this order (or in the ascending order). Correspondingly, the contacts 322 are grouped into first to n-th contact groups depending on the rows. The contacts arrayed in the i-th row are collectively referred to as the i-th contact group.

For any i from one to n, the bumps (the active bumps 311, 331 and dummy bumps 321) belonging to the i-th bump group are arrayed in the first direction with the first pitch. Correspondingly, the contacts belonging to the i-th contact group are arrayed in the first direction with the first pitch.

For any integer j from one to n−1, the j-th bump group and the (j+1)-th bump group are shifted from each other by the second pitch in the second direction and the (j+1)-th bump group is shifted from the j-th bump group by the sub-pitch in the first direction. Correspondingly, the j-th contact group and the (j+1)-th contact group are shifted from each other by the second pitch in the second direction and the (j+1)-th contact group is shifted from the j-th contact group by the sub-pitch in the first direction.

Figure 4:
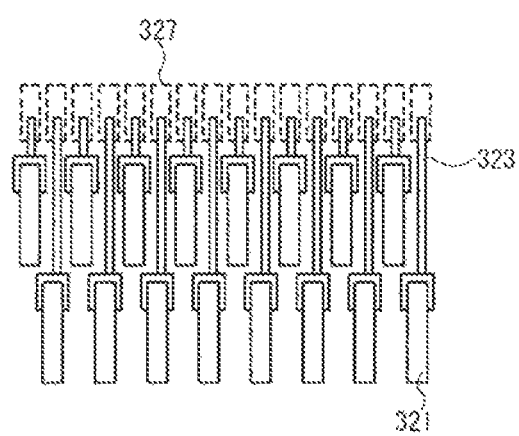
FIG. 4 illustrates one exemplary arrangement of dummy bumps that are arranged in a two-row staggered arrangement.

FIG. 4 illustrates one exemplary arrangement of the dummy bumps 321 that are arranged in a two-row staggered arrangement, and FIG. 5 illustrates an exemplary arrangement of the dummy bumps 321 that are arranged in a four-row staggered arrangement.

FIG. 6A illustrates an arrangement of various bump groups, denoted by numerals 41 to 44, in one configuration example of a semiconductor device 4 in an embodiment of the present invention. The semiconductor device 4 illustrated in FIG. 6A includes a first active bump group 41, a dummy bump group 42, a second active bump group 43 and a power supply bump group 44.

The first active bump group 41 includes a plurality of active bumps 411 and the dummy bump group 42 includes a plurality of dummy bumps 421. The second active bump group 43 includes a plurality of active bumps 431 and the power supply bump group 44 includes a plurality of power supply bumps 441.

In the example illustrated in FIG. 6A, the first active bump group 41, the dummy bump group 42 and the second active bump group 43 are arranged along the edge facing the +y direction (which is illustrated as the upper edge in FIG. 6A) of the semiconductor device 4. The power supply bump group 44 is, on the other hand, arranged along another edge facing the −y direction (which is illustrated as the lower edge in FIG. 6A) of the semiconductor device 4.

The first active bump group 41 is arranged near the left edge (the edge facing the −x direction) of the semiconductor device 4 and the second active bump group 43 is arranged near the right edge (the edge facing the +x direction) of the semiconductor device 4. The dummy bump group 42 is arranged between the first active bump group 41 and the second active bump group 43.

In the example illustrated in FIG. 6A, the active bumps of the first and second active bump groups 41 and 43 and the dummy bumps of the dummy bump group 42 are arranged on the surface of the semiconductor device 4 to form the above-described three-row staggered arrangement in total.

The dummy bumps of the dummy bump group 42, on the other hand, have a length longer than the active bumps in the vertical direction (the y-axis direction in FIG. 6A) and are arrayed in the horizontal direction (the x-axis direction in FIG. 6A).

Figure 6B:
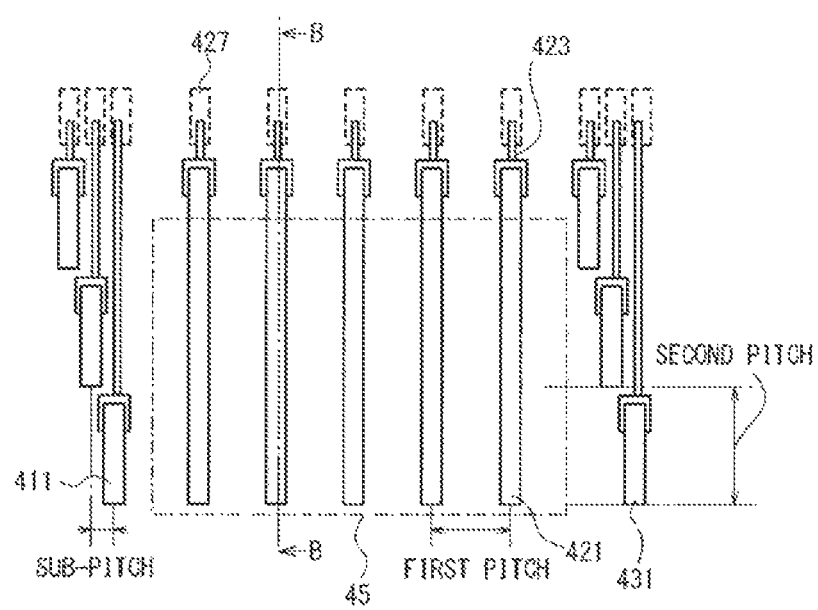
FIG. 6B is a plan view illustrating a detailed example of the arrangement of active bump groups and a dummy bump group, which are illustrated in FIG. 6A.
Figure 6C:
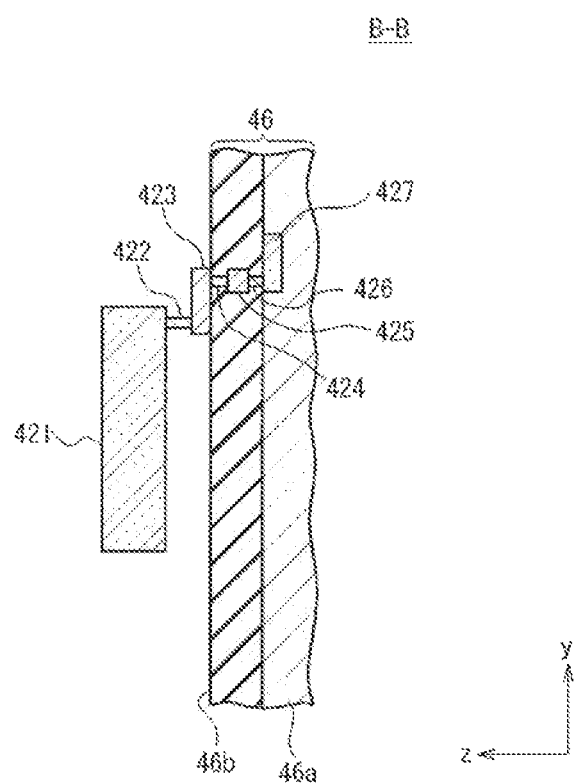
FIG. 6C is a sectional view illustrating the cross-section structure of the semiconductor device on the section B-B indicated in FIG. 6B.

FIG. 6B is a plan view illustrating a detailed example of the arrangement of the active bump groups 41, 43 and the dummy bump group 42, which are illustrated in FIG. 6A and FIG. 6C is a sectional view illustrating the cross-section structure of the semiconductor device 4 on the section B-B indicated in FIG. 6B.

The structure illustrated in FIG. 6B includes a plurality of first active bumps 411, a plurality of dummy bumps 421, a plurality of second active bumps 431, a plurality of protection elements 427, and a plurality of top metal interconnections 423, which are used for providing electrical connections with the protection elements 427. Illustrated in the sectional view of in FIG. 6B are a dummy bump 421, a contact 422, a top metal interconnection 423, a first through-hole contact 424, an internal interconnection 425, a second through-hole contact 426 and a protection element 427.

In FIG. 6B, the protection elements 427, which provide protection from electrostatic discharge, are indicated, by broken lines since the protection elements 427 are integrated within a main structure 46 of the semiconductor device 4 illustrated in FIG. 6A, wherein, as shown in FIG. 6C, the main structure 46 includes a semiconductor substrate 46a incorporating various elements (including the protection elements 427) and internal interconnections (one shown as element 425 in FIG. 6C) that provide connections among the elements. Other elements illustrated in FIG. 6B are provided on or over the main, structure 46 of the semiconductor device 4.

The connections among the elements illustrated in FIGS. 6B and 6C are as follows: Each dummy bump 421 is electrically connected with a protection element 427 via a contact 422, a top metal interconnection 423, a first through-hole contact 424, an internal interconnection 425 and a second through-hole contact 426, which are serially connected in this order. The connection between a dummy bump 421 and a protection element 427 may be variously modified in accordance with the arrangement of the protection element 427. For example, a dummy bump 421 and a protection element 427 may be connected via a single through-hole contact in place of the combination of the first through-hole contact 424, the internal interconnection 425 and the second through-hole contact 426. Alternatively, additional internal interconnections and/or through-hole contacts may be used.

Referring back to FIG. 6C, the dummy bump 421 is connected with the top surface 46b of the main structure 46 via the contact 422 and the top metal interconnection 423. Each dummy bump 421 is spaced from the top surface 46b of the main structure 46 of the semiconductor device 4 with a predetermined spacing. The spacing between the dummy bumps 421 and the top surface 46b of the main structure 46, which mainly depends on the structure of the contacts 422, is preferably equal for all the dummy bumps 421. All the dummy bumps 421 are arranged along the top surface 46b of the main structure 46 of the semiconductor device 4.

Although not illustrated, the first and second active bumps 411 and 431 are structured similarly to the dummy bumps 421. All the active bumps 411 and 431 of the first and second active bump groups 41 and 43 are also arranged along the top surface 46b of the main structure 46 of the semiconductor device 4. It is preferable that the spacing from the top surface 46b of the semiconductor device 4 is equal for all of the active bumps 411, 431 and the dummy bumps 421. Each of the active bumps 411, 431 is also electrically connected with a protection element 427 via a contact 422, a top metal interconnection 423, a first through-hole contact 424, an internal interconnection 425 and a second through-hole contact 426, which are serially connected in this order. It should be noted however that the active bumps 411 and 431 are further connected with a circuit related to signaling to the display panel 1, differently from the dummy bumps 421.

In the present embodiment, the active bumps 411 and 431 are arranged in a "three-row staggered arrangement", similarly to the arrangement illustrated in FIG. 3A. In the following, as is the case with the arrangement illustrated in FIG. 3A, the pitch with which the active bumps 411 and 431 are arrayed in the horizontal direction (the x-axis direction) is referred to as the first pitch, and the pitch with which the active bumps 411 and 431 are arrayed in the vertical direction (the y-axis direction) is referred to as the second pitch. Furthermore, the amount of the shift between the adjacent rows of bumps is referred to as the sub-pitch.

On the other hand, the dummy bumps 421 each have a length about three times as long as the active bumps 411 and 431 in the vertical direction, (the y-axis direction), and are arrayed in one row in the horizontal direction (the x-axis direction). The pitch with which the dummy bumps 421 are arrayed in the horizontal direction (the x-axis direction) is preferably equal to the first pitch, with which the active bumps 411 and 431 are arrayed.

This structure is derived from a requirement of evenness of the bump arrangement suitable for device mounting with an ACF; the pitch of the dummy bumps 421 may differ from that of the active bumps 411 and 431 to a certain degree, if satisfying this requirement. It should be especially noted that the distance of the active bumps 411 and 431 positioned in the top row from the closest dummy bumps 421 may be different from the distance of those positioned in the bottom row from the closest dummy bumps 421 by one to two times of the sub-pitch. In order to suppress an influence of such a difference on the device mounting, the bumps 411, 421 and 431 may be arranged so that the pitch of the active bumps 411 and 431 positioned in the middle row and the dummy bumps 421 is constant.

In the present embodiment, to improve the arrangement evenness required by device mounting with an AFC, the dummy bumps 421 are designed so that the length of the dummy bumps 421 in the vertical direction is about three times of that of the active bumps 411 and 431. The ends of the dummy bumps 421 facing the +y direction (the upper ends in FIG. 6B) are aligned with the corresponding ends of the active bumps 411 and 431 positioned in the top row and the ends of the dummy bumps 421 facing the −y direction (the lower ends in FIG. 6B) are aligned with the corresponding ends of the active bumps 411 and 431 positioned in the bottom row.

Accordingly, the arrangement of the dummy bumps 421 in the present embodiment illustrated in FIG. 6B, that is, the arrangement of the dummy bump group 42 illustrated in FIG. 6A, satisfies a bump arrangement evenness required by the device mounting with an ACF, as is the case with the arrangement illustrated in FIGS. 2 and 3A.

Furthermore, the bump arrangement of the present embodiment offers an advantage of securing a top metal interconnection placement allowed region 45 with a significant area on the top surface 46b of the main structure 46 of the semiconductor device 4 in the present embodiment. The area of the top metal interconnection placement allowed region 45 is almost equal to the region occupied by the dummy bumps 421 of the top surface 46b of the main structure 46.

In other words, the structure of the present embodiment allows removing portions of the top metal interconnections arranged in the top metal interconnection placement impossible region 35 illustrated in FIG. 3A.

One reason is that the total number of the dummy bumps 421 is reduced down to about one n-th of the n-row staggered arrangement illustrated in FIG. 4A and the total number of the protection elements 421 for electrical protection of the dummy bumps 421 is also reduced accordingly. This also improves easiness of placement of modules as described later.

Another reason is that all the contacts 422, which connect the dummy bumps 421 with the main structure 46 of the semiconductor device 4, are disposed at or in the vicinity of the upper ends (facing the +y direction). More specifically, the contacts 422 connected with the dummy bumps 412 are aligned with the contacts 422 connected with the active bumps 411 and 431 positioned in the top row of the three-row staggered arrangement in the present embodiment.

This allows a top metal interconnection to be placed in the top metal interconnection placement allowed region 45 as desired. Such a top metal interconnection makes it easy to supply a power supply voltage to a module integrated within the main structure 46 below the top metal interconnection.

Figure 7A:
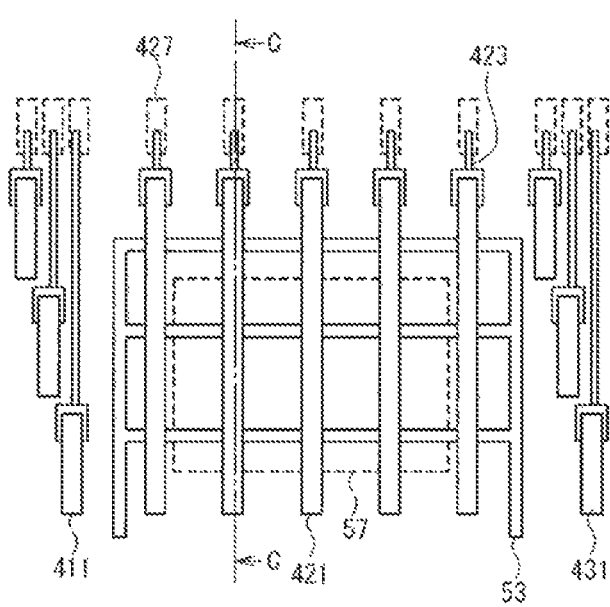
FIG. 7A illustrates an exemplary structure in which a power supply top metal interconnection is placed in a top metal placement allowed region.
Figure 7B:
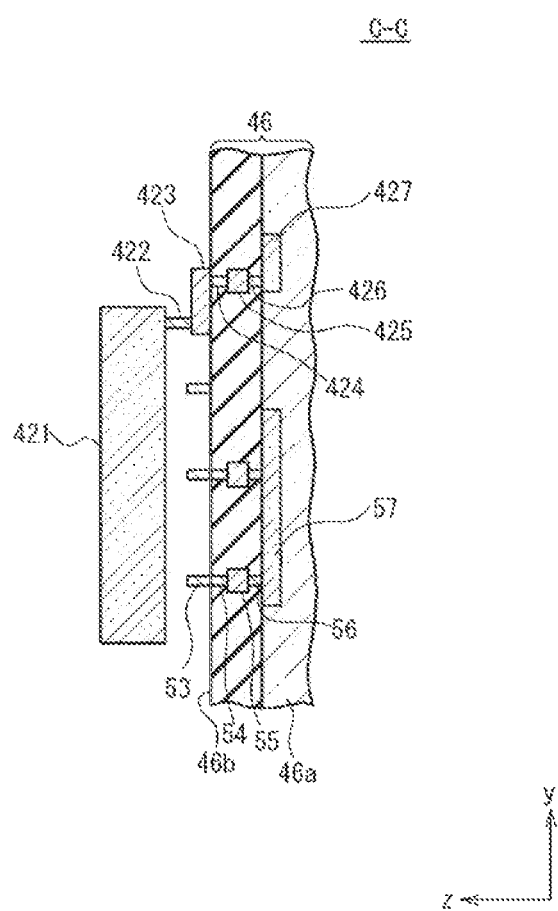
FIG. 7B is a sectional view illustrating the structure on the section C-C indicated in FIG. 7A.

FIG. 7A illustrates an exemplary structure in which a power supply top metal interconnection 53 is placed in the top metal interconnection placement allowed region 45, and FIG. 7B is a sectional view illustrating the structure on the section C-C indicated in FIG. 7A.

The structure illustrated in FIG. 7A is obtained by adding the power supply top metal interconnection 53 and a module 57 to the structure illustrated in FIG. 6B. Correspondingly, the cross-section structure illustrated in FIG. 7B is obtained by adding the power supply top metal interconnection 53, first through-hole contacts 54, internal interconnections 55, second through-hole contacts 56 and the module 57.

The module 57 illustrated in FIGS. 7A and 7B includes a circuit block that is integrated in the semiconductor substrata 46a of the main structure 46 of the semiconductor device 4 and has a desired function. The power supply top metal interconnection 53 is formed on the top surface 46b of the main structure 46 of the semiconductor device 4 to feed a power supply voltage to the module 57. As illustrated in FIG. 7B, first through-hole contacts 54, internal interconnections 55 and second through-hole contacts 56 are integrated within the main structure 46 of the semiconductor device 4 and respective one of the first through-hole contacts 54, respective one of the internal interconnections 55 and respective one of the second through-hole contacts 56 are serially connected in this order. The connection between the power supply top metal interconnection 53 and the module 57 may be variously modified from the combination of the first through-hole contacts 54, the internal interconnections 55 and the second through-hole contacts 56, depending on the arrangement of the module 57 as is the case with the combination of the first through-hole contact 424, the internal interconnection 425 and the second through-hole contact 426.

It should be noted that the power supply top metal interconnection 53 is electrically separated from the top metal interconnections 423, which are used for electrical connections with the protection elements 427, without interference or direct contact.

Other elements illustrated in FIGS. 7A and 7B are structured similarly to the corresponding elements illustrated in FIGS. 6B and 6C.

It should be noted that the structure illustrated in FIG. 3A also allows placing the module 57 at the position indicated in FIGS. 7A and 7B; however, this requires using an internal interconnection integrated within the main structure 46 as an interconnection that feeds the power supply voltage to the module 57 in the semiconductor device 4. In general, internal interconnections integrated within the main structure 46 tend to have an increased impedance due to strong restrictions on the dimensions of the internal interconnections, especially in the thickness direction. In contrast, the structure of the present embodiment, in which the power supply top metal interconnection 53 is placed just below the dummy bumps 421 as illustrated in FIGS. 7A and 7B, is suitable for feeding a power supply voltage to the module 57 placed just below the power supply top metal interconnection 53. This is because top metal interconnections, which are positioned closest to the surface of the semiconductor device, have an increased flexibility in the dimensions thereof, especially in the thickness direction.

The power supply top metal interconnection 53 also has a flexibility in the routing, since the top metal interconnections 323 illustrated in FIG. 3A are removed in the present embodiment; for example, the power supply top metal interconnection 53 can be routed so that the power supply top metal interconnection 53 intersects adjacent two dummy bumps 421 under the dummy bumps 421, as illustrated in FIG. 7A.

In the following, a description is given of variations of the present embodiment, with respect to the length of the dummy bumps 421.

Figure 7C:
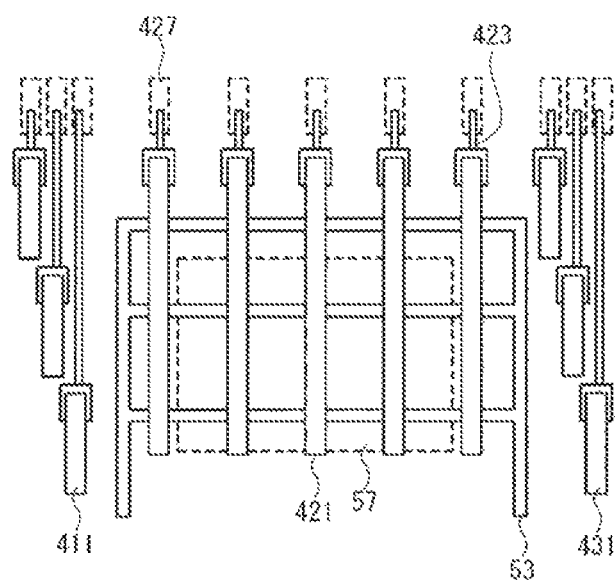
FIG. 7C illustrates one modification of the structure illustrated in FIG. 7A, in which the length of the dummy bumps is reduced.

FIG. 7C illustrates one modification of the structure illustrated in FIG. 7A, in which the length of the dummy bumps 421 is reduced. In the structure illustrated in FIG. 7A, the ends of the dummy bumps 421 facing the −y direction (the lower ends in FIG. 7A) are aligned with the corresponding ends of the active bumps 411 and 431 positioned in the bottom row of the three-row staggered arrangement. This structure is, however, merely one example; the ends of the dummy bumps 421 may be out of alignment with the corresponding ends of the active bumps 411 and 431 positioned in the bottom row. In view of the arrangement evenness required by device mounting with an ACF, however, it is preferable that the dummy bumps 421 has a length of 2.5 times or more of the length of the active bumps 411 and 431 for a three-row staggered arrangement, or has a length of 1.5 times or more of the length of the active bumps 411 and 431 for a two-row staggered arrangement.

Figure 7D:
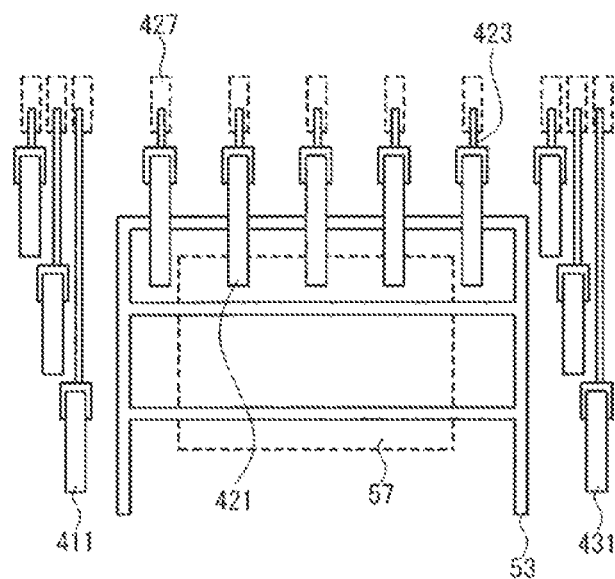
FIG. 7D illustrates another modification of the structure illustrated in FIG. 7A, in which the length of the dummy bumps is further reduced.

FIG. 7D illustrates another modification of the structure illustrated in FIG. 7A, in which the length of the dummy bumps 421 is further reduced. The length of the dummy bumps 421 in the structure illustrated in FIG. 7D is shorter than that in the structure illustrated in FIG. 7C; in one comparison, the length of the dummy bumps 421 in the structure illustrated in FIG. 7D is only slightly longer than the second pitch of the active bumps 411 and 431, which are arranged in the three-row staggered arrangement. More specifically, the dummy bumps 421 in the structure illustrated in FIG. 7D have such a length that the dummy bumps 421 are extended in the y-axis direction from the positions aligned with the contacts 422 connected with the active bumps 411 and 431 positioned in the top row to the positions aligned with the contacts 422 connected with the active bumps 411 and 431 positioned in the middle row.

The above-described advantage of the present embodiment can be obtained also when the dummy bumps 421 have the lengths illustrated in FIGS. 7C and 7D.

Figure 8A:
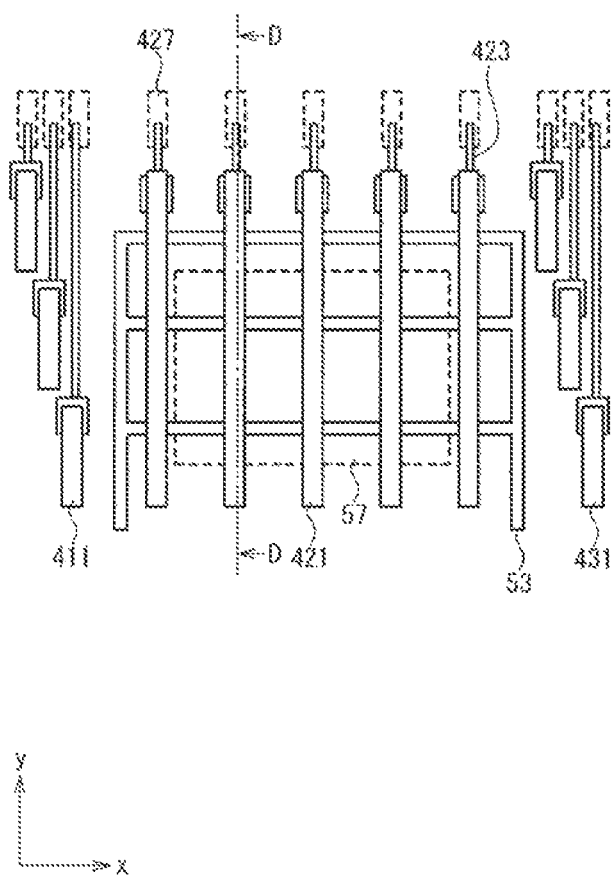
FIG. 8A illustrates one example of the arrangement of dummy bumps, active bumps and a power supply top metal interconnection of a semiconductor device according to a one embodiment.
Figure 8B:
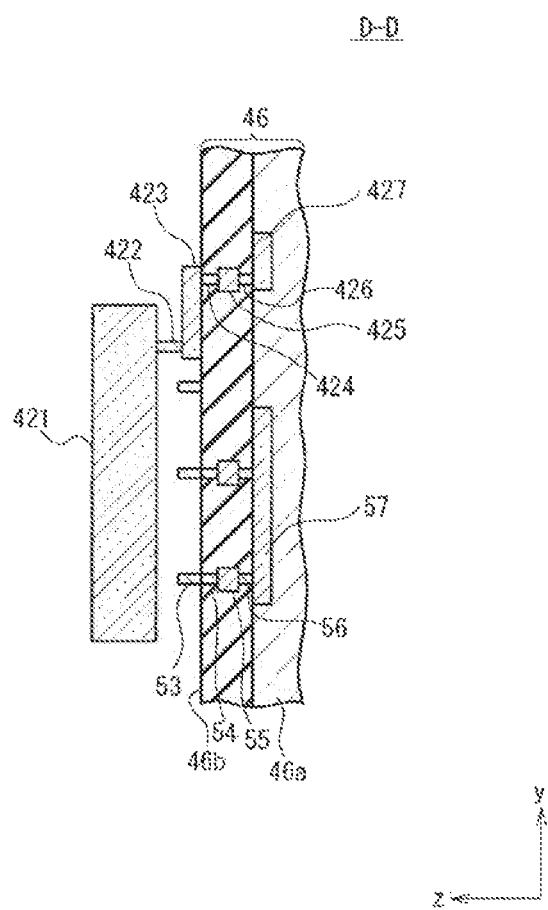
FIG. 8B is a sectional view illustrating the cross-section structure of the semiconductor device on the section D-D illustrated in FIG. 8A.

FIG. 8A illustrates one example of the arrangement of the dummy bumps 421, the active bumps 411 and 431 and the power supply top metal interconnection 53 in semiconductor device 4 according to another embodiment, and FIG. 8B is a sectional view illustrating the cross-section structure of the semiconductor device 4 on the section D-D illustrated in FIG. 8A. The overall structure of the semiconductor device 4 in the present embodiment is similar to that of the embodiment illustrated in FIG. 6A.

The structure according to the present embodiment illustrated in FIGS. 8A and 8B is obtained by modifying the structure illustrated in FIGS. 7A and 7B as follows: The top metal interconnections 423 are extended in the −y direction (the downward direction in FIG. 8A) and the contacts 422 are moved also in the −y direction. Although the contacts 422 are connected with the dummy bumps 421 at the end portions of the dummy bumps 421 facing the +y direction (the upper ends in FIGS. 6B and 7A) in the embodiments illustrated in FIGS. 6A, 6B, 7A and 7B, the contacts 422 are now connected with the dummy bumps 421 at positions away from the ends facing the +y direction in the present embodiment.

As recited in the present embodiment, the positions at which the dummy bumps 421 are connected with the contacts 422 may be flexibly modified. Such flexibility may be combined with other flexibilities recited in other embodiments.

Figure 9A:
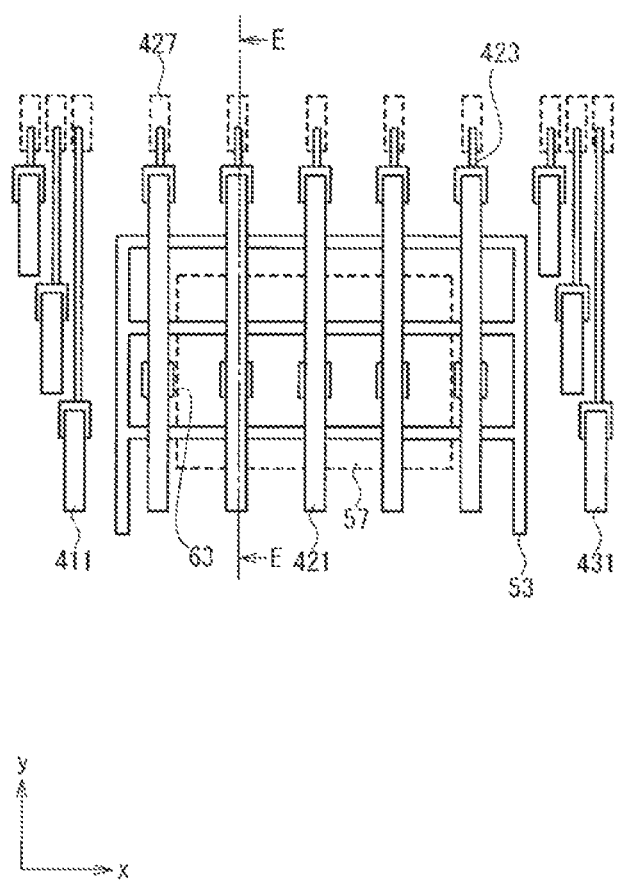
FIG. 9A illustrates one example of the arrangement of dummy bumps, active bumps and a power supply top metal interconnection a in a semiconductor device according to a one embodiment.
Figure 9B:
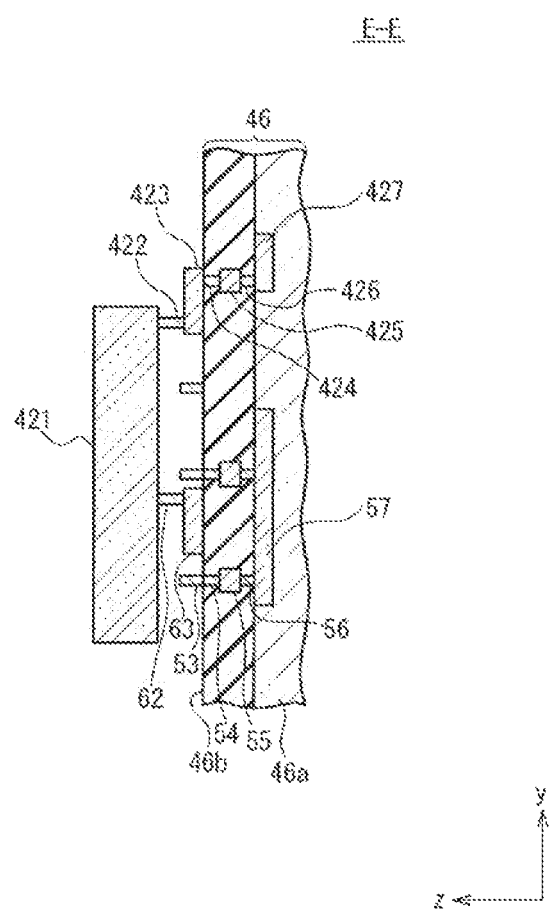
FIG. 9B is a sectional view illustrating the cross-section structure of the semiconductor device on the section E-E illustrated in FIG. 9A.

FIG. 9A illustrates one example of the arrangement of the dummy bumps 421, the active bumps 411 and 431 and the power supply top metal interconnection 53 in the semiconductor device 4 according to a one embodiment, and FIG. 9B is a sectional view illustrating the cross-section structure of the semiconductor device 4 on the section E-E illustrated in FIG. 9A. The overall structure of the semiconductor device 4 in the present embodiment is similar to that of the embodiment illustrated in FIG. 6A.

The structure according to the present embodiment illustrated in FIGS. 9A and 9B is obtained by modifying the structure illustrated in FIGS. 7A and 7B as follows: A contact 62 and a top metal interconnection 63 are additionally connected with each of the dummy bumps 421 for reinforcing the connection with each of the dummy bumps 421.

Each top metal interconnection 63 is disposed on the top surface 46b of the main structure 46 of the semiconductor device 4 at a position just below the middle portion of the corresponding dummy bump 421 so that each top metal interconnection 63 does not interfere with the power supply top metal interconnection 53. Each contact 62 is connected between the respective one of the dummy bumps 421 and the respective one of the top metal interconnection 63.

In the present embodiment, the middle portion of each dummy bump 421 is fixed with the top surface 46b of the main structure 46 with the contact 62 and the top metal interconnection 63. This additional structure effectively suppresses structural deficiencies of the dummy bumps 421 with a length longer than that of the active bumps 411 and 431, including deformation at the connecting portions with the main structure 46, breakage of the dummy bumps 421 and peel-off of the dummy bumps 421.

It should be noted that, as illustrated in FIGS. 9A and 9B, other elements of the semiconductor device 4 in the present embodiment are structured similarly to the corresponding elements illustrated in FIGS. 7A and 7B.

Figure 10B:
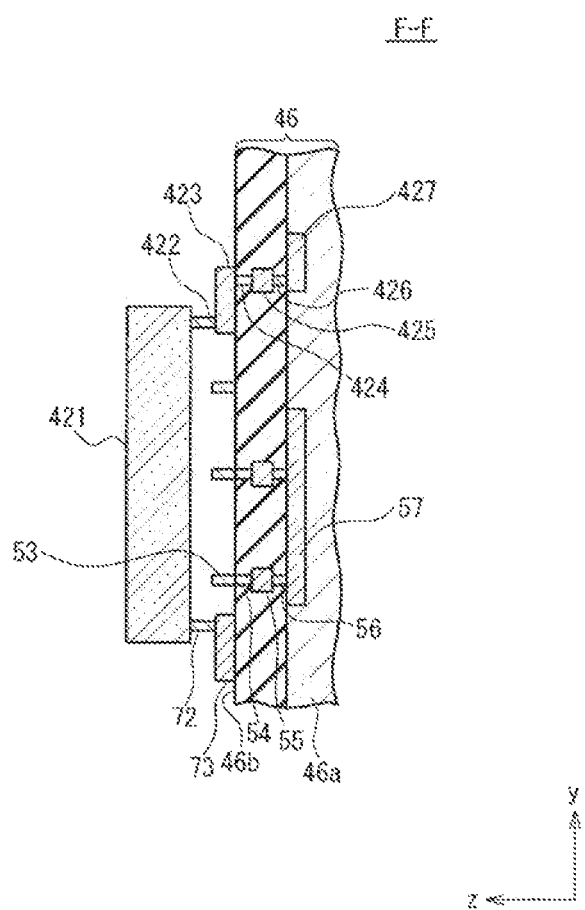
FIG. 10B is a sectional view illustrating the cross-section structure of the semiconductor device on the section F-F illustrated in FIG. 10A.

FIG. 10A illustrates one example the arrangement of the dummy bumps 421, the active bumps 411 and 431 and the power supply top metal interconnection 53 in the semiconductor device 4 according to a one embodiment, and FIG. 10B is a sectional view illustrating the cross-section structure of the semiconductor device 4 on the section F-F illustrated in FIG. 10A. The overall structure of the semiconductor device 4 in the present embodiment is similar to that of the embodiment illustrated in FIG. 6A.

The structure according to the present embodiment illustrated in FIGS. 10A and 10B is obtained by modifying the structure illustrated in FIGS. 7A and 7B as follows: A contact 72 and a top metal interconnection 73 are additionally connected with each of the dummy bumps 421 for reinforcing the connection with each of the dummy bumps 421.

Each top metal interconnection 73 is disposed on the top surface 46b of the main structure 46 of the semiconductor device 4 at a position just below the and portion of the corresponding dummy bump 421 opposite to the end portion connected with the contact 422, so that each top metal interconnection 73 does not interfere with the power supply top metal interconnection 53. Each contact 72 is connected between the respective one of the dummy bumps 421 and the respective one of the top metal interconnection 73.

Also in the present embodiment, the end portion of each dummy bump 421 is fixed with the top surface 46b of the main structure 46 with the contact 72 and the top metal interconnection 73. This additional structure effectively suppresses structural deficiencies of the dummy bumps 421 with a length longer than that of the active bumps 411 and 431, including deformation at the connecting portions with the main structure 46, breakage of the dummy bumps 421 and peel-off of the dummy bumps 421.

It should be noted that, as illustrated in FIGS. 10A and 10B, other elements of the semiconductor device 4 in the present embodiment are structured similarly to the corresponding elements illustrated in FIGS. 7A and 7B.

Although various embodiments of the present invention are specifically described in the above, the present invention should not be construed as being limited to the above-described embodiments. A person skilled in the art would appreciate that the present embodiment may be implemented with various modifications without departing from the scope of the invention.

The respective features recited in the above-described embodiments may be variously combined as long as no technical contradiction occurs. It should be especially noted that the top metal interconnections 63 and 73 and the contacts 62 and 72 recited in the third and fourth embodiments may be concurrently used, and further additional top metal interconnections and contacts may be disposed for reinforcing the connection with the bumps. The addition of the top metal interconnections and contacts for reinforcing the connection with the bumps, the modification of the length of the dummy bumps and the modification of the positions of the contacts that connect the dummy bumps with the protection elements may be flexibly combined as long as no interference occurs with the active bumps 411, 431 and the power supply top metal interconnection 53.

What is claimed is:

1. A semiconductor device, comprising:
   a main structure including a semiconductor substrate;
   a plurality of active bumps provided over a surface of the main structure;
   a plurality of dummy bumps provided over the surface of the main structure;
   a plurality of active bump protection elements that are integrated in the main structure and respectively provide electrical protections for the active bumps;
   a plurality of first top metal interconnections that respectively provide electrical connections between the active bump protection elements and the active bumps via a plurality of active bump contacts;
   a plurality of dummy bump protection elements that are integrated in the main structure and respectively provide electrical protections for the dummy bumps;
   a plurality of second top metal interconnections that respectively provide electrical connections between the dummy bump protection elements and the dummy bumps via a plurality of dummy bump contacts; and
   a third top metal interconnection formed on the surface of the main structure and is electrically separated from the first and second top metal interconnections,
   wherein the active bumps are arranged in first to n-th rows, where n is an integer equal to two or more,
   wherein the active bumps are arrayed with a first pitch in a first direction that is parallel to the surface of the main structure,
   wherein the first to n-th rows of the active bumps are arrayed in an ascending order in a second direction parallel to the surface of the main structure and perpendicular to the first direction,
   wherein, for j being any integer from one to n−1, a (j+1)-th row of the active bumps are shifted in the second direction from a j-th row of the active bumps by a second pitch and shifted in the first direction from the j-th row of the active bumps by a predetermined sub-pitch,
   wherein the dummy bumps are arrayed in the first direction with the first pitch,
   wherein the length of each of the dummy bumps in the second direction is longer than the second pitch, and
   wherein the third top metal interconnection is formed on the surface of the main structure to pass through a region between two adjacent dummy bumps selected from the dummy bumps and is electrically separated from the dummy bumps.

2. The semiconductor device according to claim 1,
   wherein the plurality of active bump contacts respectively connect the active bumps with the surface of the main structure;
   wherein the plurality of dummy bump contacts respectively connect the dummy bumps with the surface of the main structure,
   wherein the active bump contacts are arranged in first to n-th rows,
   wherein the first to n-th rows of the active bump contacts are arrayed in an ascending order in the second direction,
   wherein the active bump contacts are positioned in each of the first to n-th rows are arrayed in the first direction with the first pitch,
   wherein for x being any integer from one to n−1, a (x+1)-th row of the active bump contacts are shifted in the second direction from a x-th row of the active bump contacts by the second pitch and shifted in the first direction from the x-th row of the active bump contacts by the sub-pitch, and wherein the dummy bump contacts are arrayed in the first direction with the first pitch.

3. The semiconductor device according to claim 2, wherein the dummy bump contacts are respectively connected with the dummy bumps at end portions in the second direction of the dummy bumps.

4. The semiconductor device according to claim 3, further comprising:

a plurality of dummy bump reinforcing contacts connected with middle portions in the second direction of the respective dummy bumps; and a plurality of fourth top metal interconnections formed on the surface of the main structure and respectively connected with the dummy bump reinforcing contacts.

5. The semiconductor device according to claim 3, further comprising:

a plurality of dummy bump reinforcing contacts connected with other end portions in the second direction of the respective dummy bumps; and a plurality of fourth top metal interconnections formed on the surface of the main structure and respectively connected with the dummy bump reinforcing contacts.

6. The semiconductor device according to claim 2, wherein the dummy bump contacts are respectively connected with the dummy bumps at middle portions of the dummy bumps in the second direction.

7. The semiconductor device according to claim 2, wherein the dummy bump contacts are aligned in the first direction with the active bump contacts positioned in the first row, and wherein respective ends in the second direction of the dummy bumps are aligned with respective ends in the second direction of the active bumps positioned in the n-th row.

8. The semiconductor device according to claim 2, wherein the dummy bump contacts are arrayed along one edge of the semiconductor substrate.

9. A semiconductor device comprising:

a main structure including a semiconductor substrate;

a plurality of active bumps provided over a surface of the main structure;

a plurality of dummy bumps provided over the surface of the main structure;

a plurality of active bump protection elements that are integrated in the main structure and respectively provide electrical protections for the active bumps;

a plurality of first top metal interconnections that respectively provide electrical connections between the active bump protection elements and the active bumps via active bump contacts;

a plurality of dummy bump protection elements that are integrated in the main structure and respectively provide electrical protections for the dummy bumps;

a plurality of second top metal interconnections that respectively provide electrical connections between the dummy bump protection elements and the dummy bumps via dummy bump contacts; and a third top metal interconnection formed on the surface of the main structure and electrically separated from the first and second top metal interconnections, wherein the active bumps are arranged in first to n-th rows, where n is an integer equal to two or more, wherein the active bumps are arrayed with a first pitch in a first direction that is parallel to the surface of the main structure, wherein the first to n-th rows of the active bumps are arrayed in an ascending order in a second direction parallel to the surface of the main structure and perpendicular to the first direction, wherein, for i being any integer from one to n−1, a (i+1)-th row of the active bumps are shifted in the second direction from a i-th row of the active bumps by a second pitch and shifted in the first direction from the i-th row of the active bumps by a predetermined sub-pitch, wherein the dummy bumps are arrayed in the first direction with the first pitch, wherein the length of each of the dummy bumps in the second direction is longer than the second pitch, and wherein the third top metal interconnection intersects at least one of two adjacent dummy bumps selected from the dummy bumps, and is electrically separated from the dummy bumps.

10. The semiconductor device according to claim 1, wherein a length of the dummy bumps in the second direction is at least 1.5 times a length of the active bumps in the second direction.

11. An apparatus, comprising:

a main structure including a semiconductor substrate;

a plurality of active bumps provided over a surface of the main structure;

a plurality of dummy bumps provided over the surface of the main structure;

a plurality of active bump protection elements that are integrated in the main structure and respectively provide electrical protections for the active bumps;

a plurality of first top metal interconnections that respectively provide electrical connections between the active bump protection elements and the active bumps via active bump contacts;

a plurality of dummy bump protection elements that are integrated in the main structure and respectively provide electrical protections for the dummy bumps;

a plurality of second top metal interconnections that respectively provide electrical connections between the dummy bump protection elements and the dummy bumps via dummy bump contacts; and a third top metal interconnection formed on the surface of the main structure and electrically separated from the first and second top metal interconnections, wherein the active bumps are arranged in at least two rows with a first pitch in a first direction that extends along the rows, wherein the rows are arranged in a staggered arrangement such that active bumps in two adjacent rows are misaligned in a second direction perpendicular to the first direction, wherein the dummy bumps are arrayed in the first direction, wherein the length of each of the dummy bumps in the second direction is longer than a length of each of the active bumps in the second direction, and wherein the third top metal interconnection intersects at least one of the dummy bumps, and is electrically separated from the dummy bumps.

12. The apparatus of claim 11, wherein the plurality of active bump contacts respectively connect the active bumps with the surface of the main structure; and wherein the plurality of dummy bump contacts respectively connect the dummy bumps with the surface of the main structure, wherein the active bump contacts are arranged in at least two rows that extend in the first direction, wherein the active bump contacts are positioned in each of the first to n-th rows are arrayed in the first direction with the first pitch, wherein the active bump contacts are arranged in a staggered manner in the at least two rows, and wherein the dummy bump contacts are arrayed in the first direction with the first pitch.

13. The apparatus of claim 12, wherein the dummy bump contacts are respectively connected with the dummy bumps at end portions in the second direction of the dummy bumps.

14. The apparatus of claim 12, further comprising:
a plurality of dummy bump reinforcing contacts connected with middle portions in the second direction of the respective dummy bumps; and
a plurality of fourth metal interconnections formed on the surface of the main structure and respectively connected with the dummy bump reinforcing contacts.

15. The apparatus of claim 12, wherein the dummy bump contacts are respectively connected with the dummy bumps at middle portions of the dummy bumps in the second direction.

16. An apparatus comprising:
a main structure including a semiconductor substrate;
a plurality of active bumps provided over a surface of the main structure a plurality of dummy bumps provided over the surface of the main structure;
a plurality of active bump protection elements that are integrated in the main structure and respectively provide electrical protections for the active bumps;
a plurality of first metal interconnections that respectively provide electrical connections between the active bump protection elements and the active bumps via the active bump contacts;
a plurality of dummy bump protection elements that are integrated in the main structure and respectively provide electrical protections for the dummy bumps;
a plurality of second metal interconnections that respectively provide electrical connections between the dummy bump protection elements and the dummy bumps via the dummy bump contacts; and
a third metal interconnection formed on the surface of the main structure
wherein the active bumps are arranged in at least two rows with a first pitch in a first direction that extends along the rows,
wherein the rows are arranged in a staggered arrangement such that active bumps in two adjacent rows are misaligned in a second direction perpendicular to the first direction wherein the dummy bumps are arrayed in the first direction,
wherein the length of each of the dummy bumps in the second direction is longer than a length of each of the active bumps in the second direction, and
wherein the third metal interconnection is formed on the surface of the main structure to pass passes through a region between two adjacent two dummy bumps selected from the dummy bumps and is electrically separated from the dummy bumps.

17. A system, comprising:
a display panel;
a main structure including a semiconductor substrate;
first and second pluralities of active bumps provided over a surface of the main structure;
a plurality of dummy bumps provided over the surface of the main structure and disposed between the first and second plurality of active bumps;
a plurality of active bump protection elements that are integrated in the main structure and respectively provide electrical protections for the active bumps;
a plurality of active bump protection elements that are integrated in the main structure and respectively provide electrical protections for the first and second pluralities of active bumps;
a plurality of first top metal interconnections that respectively provide electrical connections between the active bump protection elements and the first and second pluralities of the active bumps via active bump contacts;
a plurality of dummy bump protection elements that are integrated in the main structure and respectively provide electrical protections for the dummy bumps;
a plurality of second top metal interconnections that respectively provide electrical connections between the dummy bump protection elements and the dummy bumps via dummy bump contacts; and
a third top metal interconnection formed on the surface of the main structure and is electrically separated from the first and second top metal interconnections,
wherein both the first and second pluralities of active bumps are arranged in at least two rows with a first pitch in a first direction that extends along the rows,
wherein the rows are arranged in a staggered arrangement such that active bumps in two adjacent rows are misaligned in a second direction perpendicular to the first direction,
wherein the dummy bumps are arrayed in the first direction,
wherein the length of each of the dummy bumps in the second direction is longer than a length of each of the active bumps in the second direction, and
wherein the third top metal interconnection intersects at least one of the dummy bumps, and is electrically separated from the dummy bumps.

18. The system of claim 17, wherein the first and second pluralities of active bumps are connected to the display panel, and wherein the dummy bumps are not connected to the display panel.

* * * * *